United States Patent
Song et al.

(10) Patent No.: US 10,411,489 B2
(45) Date of Patent: Sep. 10, 2019

(54) METHOD AND APPARATUS FOR CONTROLLING CHARGING AND DISCHARGING OF CAPACITOR MODULE, AND DISPLAY APPARATUS

(71) Applicant: BOE TECHNOLOGY GROUP CO., LTD., Beijing (CN)

(72) Inventors: Chen Song, Beijing (CN); Airong Liu, Beijing (CN); Tangxiang Wang, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 15/576,644

(22) PCT Filed: Jul. 17, 2017

(86) PCT No.: PCT/CN2017/093081
§ 371 (c)(1),
(2) Date: Nov. 22, 2017

(87) PCT Pub. No.: WO2018/036303
PCT Pub. Date: Mar. 1, 2018

(65) Prior Publication Data
US 2019/0006868 A1    Jan. 3, 2019

(30) Foreign Application Priority Data

Aug. 25, 2016    (CN) .......................... 2016 1 0730293

(51) Int. Cl.
*H02J 7/00*    (2006.01)
*H02J 7/34*    (2006.01)
(Continued)

(52) U.S. Cl.
CPC .............. *H02J 7/0068* (2013.01); *H02J 7/34* (2013.01); *H03F 3/45475* (2013.01); *H03K 5/24* (2013.01);
(Continued)

(58) Field of Classification Search
CPC . H02J 7/0068; H02J 7/34; H02J 7/345; H03F 3/45475; H03F 2200/129;
(Continued)

(56) References Cited

U.S. PATENT DOCUMENTS

2003/0052659 A1    3/2003    Monomoushi et al.
2014/0211511 A1    7/2014    Tsai et al.
2015/0009734 A1    1/2015    Stahl et al.

FOREIGN PATENT DOCUMENTS

CN    1421757 A    6/2003
CN    101320551 A    12/2008
(Continued)

OTHER PUBLICATIONS

Office Action for Chinese Patent Application No. 201610730293.8, dated Jul. 3, 2018, 15 pages (8 pages of English Translation and 7 pages of Office Action).

(Continued)

*Primary Examiner* — Robert L Deberadinis
(74) *Attorney, Agent, or Firm* — Womble Bond Dickinson (US) LLP

(57) ABSTRACT

A method is disclosed for controlling charging/discharging of a capacitor module. The capacitor module includes a plurality of branches connected in parallel, each of which includes a capacitor and a switch connected in series with the capacitor. The method includes measuring a first charge/discharge time for the capacitor module being charged/discharged from an initial voltage to an intermediate voltage, and To adjusting a second charge/discharge time for the (Continued)

capacitor module being further charged/discharged from the intermediate voltage to a target voltage by controlling on/off of at least one of the switches depending on the first charge/discharge time, the intermediate voltage being between the initial voltage and the target voltage. Also disclosed are an apparatus for controlling charging/discharging of a capacitor module and a display apparatus including the apparatus.

19 Claims, 4 Drawing Sheets

(51) Int. Cl.
*H03F 3/45* (2006.01)
*H03K 5/24* (2006.01)

(52) U.S. Cl.
CPC ......... *H02J 7/345* (2013.01); *H03F 2200/129* (2013.01); *H03F 2203/45116* (2013.01); *H03F 2203/45514* (2013.01)

(58) Field of Classification Search
CPC . H03F 2203/45116; H03F 2203/45514; H03K 5/24
See application file for complete search history.

(56) References Cited

FOREIGN PATENT DOCUMENTS

| CN | 101539698 | 9/2009 |
|----|-----------|--------|
| CN | 103713784 | 4/2014 |
| CN | 103973120 A | 8/2014 |
| CN | 104272576 A | 1/2015 |
| CN | 106410931 | 2/2017 |
| JP | 2010124582 | 6/2010 |
| JP | 2012-016109 A | 1/2012 |

OTHER PUBLICATIONS

International Search Report and Written Opinion with English Language Translation, dated Sep. 11, 2017, Application No. PCT/CN2017/093081.

METHOD AND APPARATUS FOR CONTROLLING CHARGING AND DISCHARGING OF CAPACITOR MODULE, AND DISPLAY APPARATUS

CROSS-REFERENCE TO RELATED APPLICATIONS

The present application is the U.S. national phase entry of PCT/CN2017/093081, with an international filing date of Jul. 17, 2017, which claims the benefit of Chinese Patent Application No. 201610730293.8, filed on Aug. 25, 2016, the entire disclosures of which are incorporated herein by reference.

TECHNICAL FIELD

The present disclosure relates to the field of display technology, and in particular, to a method and apparatus for controlling charging and discharging of a capacitor module as well as a display apparatus.

BACKGROUND

Capacitors are commonly used electronic elements in electronic equipment. For example, a chip for detecting a current signal in an organic light emitting display may include a plurality of capacitors that are charged/discharged with the current signal to store/release electric energies.

SUMMARY

Due to, for example, performance drift of electronic elements in an electronic device, the current used to charge/discharge the capacitors included in the electronic device may fluctuate in magnitude over a wide range so that the charge/discharge time for the capacitors also fluctuates within a wide range. This may affect the operation of the electronic device.

Embodiments of the present disclosure provide a method and apparatus for controlling charging/discharging of a capacitor module, which seeks to mitigate, alleviate or eliminate one or more of the above problems.

According to an aspect of the present disclosure, a method is provided for controlling charging/discharging of a capacitor module. The capacitor module comprises a plurality of branches connected in parallel, each of which comprises a capacitor and a switch connected in series with the capacitor. The method comprises: measuring a first charge/discharge time for the capacitor module being charged/discharged from an initial voltage to an intermediate voltage; and adjusting a second charge/discharge time for the capacitor module being further charged/discharged from the intermediate voltage to a target voltage by controlling on/off of at least one of the switches depending on the first charge/discharge time, the intermediate voltage being between the initial voltage and the target voltage.

In some embodiments, the adjusting comprises: controlling the at least one of the switches to switch on in response to the first charge/discharge time being less than a first time threshold; and controlling the at least one of the switches to switch off in response to the first charge/discharge time being greater than a second time threshold. The first time threshold is less than the second time threshold.

In some embodiments, the method further comprises resetting the at least one of the switches to an initial state in which the at least one of the switches is before initiation of the charging/discharging in response to the capacitor module being charged/discharged to the target voltage.

According to another aspect of the present disclosure, an apparatus is provided for controlling charging/discharging of a capacitor module. The capacitor module comprises a plurality of branches connected in parallel, each of which comprises a capacitor and a switch connected in series with the capacitor, the apparatus comprising: a measurement circuit configured to measure a first charge/discharge time for the capacitor module being charged/discharged from an initial voltage to an intermediate voltage; and an adjustment circuit configured to adjust a second voltage for the capacitor module being further charged/discharged from the intermediate voltage to a target voltage by controlling on/off of at least one of the switches depending on the first charge/discharge time, the intermediate voltage being between the initial voltage and the target voltage.

In some embodiments, the adjustment circuit is configured to: control the at least one of the switches to switch on in response to the first charge/discharge time being less than a first time threshold; and control the at least one of the switches to switch off in response to the first charge/discharge time being greater than a second time threshold. The first time threshold is less than the second time threshold.

In some embodiments, the measurement circuit comprises: an operational amplifier for connection in parallel with the capacitor module, the operational amplifier having an output operable to output a voltage measurement signal indicative of a voltage across the capacitor module; and a first comparator having a first input connected to the output of the operational amplifier, a second input operable to receive a first voltage signal, and an output operable to output a first output signal. The first voltage signal is indicative of the intermediate voltage, and wherein a transition of the first output signal is indicative of the first charge/discharge time.

In some embodiments, the adjustment circuit comprises a first trigger having a first input connected to the output of the first comparator, a second input operable to receive a first timing signal, and an output operable to output a first trigger signal. The first trigger is configured to output the first trigger signal in response to the transition of the first output signal being earlier than a transition of the first timing signal. The transition of the first timing signal is indicative of the first time threshold. The first trigger signal is for controlling the at least one of the switches to switch on.

In some embodiments, the adjustment circuit further comprises a second trigger having a first input connected to the output of the first comparator, a second input operable to receive a second timing signal, and an output operable to output a second trigger signal. The second trigger is configured to output the second trigger signal in response to the transition of the first output signal being later than a transition of the second timing signal. The transition of the second timing signal is indicative of the second time threshold. The second trigger signal is for controlling the at least one of the switches to switch off.

In some embodiments, the apparatus further comprises a reset circuit configured to reset the at least one of the switches to an initial state in which the at least one of the switches is before initiation of the charging/discharging in response to the capacitor module being charged/discharged to the target voltage.

In some embodiments, the reset circuit comprises a second comparator having a first input connected to the output of the operational amplifier, a second input operable to receive a second voltage signal, and an output operable to output a second output signal. The second voltage signal is indicative of the target voltage. The second output signal is for controlling the at least one of the switches to reset.

According to yet another aspect of the present disclosure, an apparatus is provided for controlling charging/discharging of a capacitor module. The capacitor module comprises a plurality of branches connected in parallel, each of which comprises a switch and a capacitor connected in series with the switch. The apparatus comprises: a measurement means for measuring a first charge/discharge time for the capacitor module being charged/discharged from an initial voltage to an intermediate voltage; and an adjustment means for adjusting a second charge for the capacitor module being further charged/discharged from the intermediate voltage to a target voltage by controlling on/off of at least one of the switches depending on the first charge/discharge time, the intermediate voltage being between the initial voltage and the target voltage.

In some embodiments, the adjustment means is for: controlling the at least one of the switches to switch on in response to the first charge/discharge time being less than a first time threshold; and controlling the at least one of the switches to switch off in response to the first charge/discharge time being greater than a second time threshold. The first time threshold is less than the second time threshold.

In some embodiments, the apparatus further comprises a reset means for resetting the at least one of the switches to an initial state in which the at least one of the switches is before initiation of the charging/discharging in response to the capacitor module being charged/discharged to the target voltage.

According to still yet another aspect of the present disclosure, a display apparatus is provided which comprises the apparatus as described above.

These and other aspects of the present disclosure will be apparent from and elucidated with reference to the embodiment(s) described hereinafter.

BRIEF DESCRIPTION OF THE DRAWINGS

Further details, features, and advantages of the disclosure are disclosed in the following description of exemplary embodiments with reference to the accompanying drawings, in which.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly is indicative of otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Embodiments of the present disclosure are described in detail below with reference to the accompanying drawings.

Figure 1:
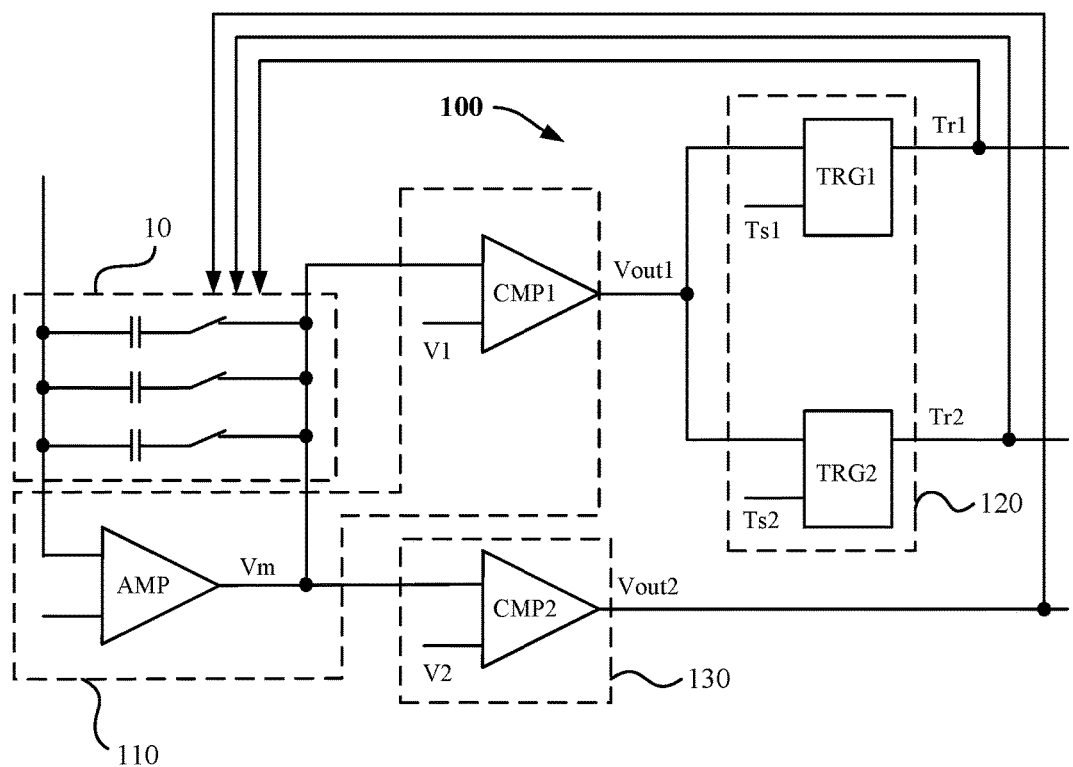
FIG. 1 schematically shows a block diagram of an apparatus for controlling charging/discharging of a capacitor module according to an embodiment of the present disclosure.

FIG. 1 schematically shows a block diagram of an apparatus 100 for controlling charging/discharging of a capacitor module according to an embodiment of the present disclosure. As shown in FIG. 1, the capacitor module 10 includes a plurality of branches connected in parallel, each of which includes a capacitor and a switch connected in series with the capacitor, and the apparatus 100 includes a measurement circuit 110 and an adjustment circuit 120.

The measurement circuit 110 is configured to measure a first charge/discharge time for the capacitor module 10 being charged/discharged from an initial voltage to an intermediate voltage.

In this embodiment, the measurement circuit 110 includes an operational amplifier AMP and a first comparator CMP1. The operational amplifier AMP is connected in parallel with the capacitor module 10. Specifically, a first input (e.g., an inverting terminal) and an output of the operational amplifier AMP are connected across the capacitor module 10, and a second input (e.g., a non-inverting terminal) of the operational amplifier AMP may be grounded. As known from the operational principle of the operational amplifier, a signal Vm (hereinafter referred to as a "voltage measurement signal") at the output of the operational amplifier AMP may indicate the voltage across the capacitor module 10. For example, the voltage measurement signal Vm may be proportional (linearly or non-linearly) to the voltage across the capacitor module 10. The first comparator CMP1 has a first input connected to the output of the operational amplifier AMP, a second input operable to receive a first voltage signal V1, and an output operable to output a first output signal Vout1. The first voltage signal V1 is indicative of the intermediate voltage and is therefore set at a fixed level. When the voltage measurement signal Vm from the operational amplifier AMP increases (or decreases) from a value smaller than the first voltage signal V1 to a value equal to the first voltage signal V1, the level of the first output signal Vout1 of the first comparator CMP1 is flipped, for example, from a low level to a high level or vice versa. Therefore, the transition (rising or falling edge) of the first output signal Vout1 is indicative of the first charge/discharge time.

The adjustment circuit 120 is configured to adjust a second charge/discharge time for the capacitor module 10 being further charged/discharged from the intermediate voltage to a target voltage by controlling on/off of at least one of the switches depending on the first charge/discharge time. The intermediate voltage is between the initial voltage and the target voltage. Specifically, the adjustment circuit 120 is configured to control the at least one of the switches to switch on in response to the first charge/discharge time being less than the first time threshold, and to control the at least one of the switches to switch off in response to the first charge/discharge time being greater than the second time threshold. The first time threshold is less than the second time threshold.

In this embodiment, the trimming circuit 120 includes a first trigger TRG1 having a first input connected to the output of the first comparator CMP1, a second input operable to receive a first timing signal Ts1, and a second input operable to output a first trigger signal Tr1. The first trigger TRG1 is configured to output the first trigger signal Tr1 in response to the transition of the first output signal Vout1 being earlier than the transition of the first timing signal Ts1. The transition of the first timing signal Ts1 is indicative of a first time threshold and the first trigger signal Tr1 is used to control the at least one of the switches to switch on. The adjustment circuit 120 further comprises a second trigger TRG2 having a first input connected to the output of the first comparator CMP1, a second input operable to receive a second timing signal Ts2, and a second input operable to output a second trigger signal Tr2. The second trigger TRG2 is configured to output the second trigger signal Tr2 in response to the transition of the first output signal Vout1 being later than the transition of the second timing signal Ts2. The transition of the second timing signal Ts2 is indicative of a second time threshold, and the second trigger signal Tr2 is used to control the at least one of the switches to switch off.

The apparatus 100 further includes a reset circuit 130 configured to reset the at least one of the switches to an initial state in which the at least one of the switches is before initiation of the charging/discharging in response to the capacitance module 10 being charged/discharged to the target voltage.

In this embodiment, the reset circuit 130 includes a second comparator CMP2 having a first input connected to the output of the operational amplifier AMP, a second input operable to receive a second voltage signal V2, and an output operable to output a second output signal Vout2. The second voltage signal V2 is indicative of the target voltage, and thus is set at a fixed level. When the voltage measurement signal Vm from the operational amplifier AMP increases (or decreases) from a value smaller than the second voltage signal V2 to a value equal to the second voltage signal V2, the second output signal Vout2 of the second comparator CMP2 is flipped, for example, from a low level to a high level or vice versa. The transition (rising or falling edge) of the second output signal Vout2 can be used to control the switches to reset.

By the adjustment circuit 120 adjusting the second charge/discharge time depending on the first charge/discharge time, the total time for the capacitor module 10 to be charged and/or discharged from the initial voltage to the target voltage can be controlled within a limited range.

Figure 2:
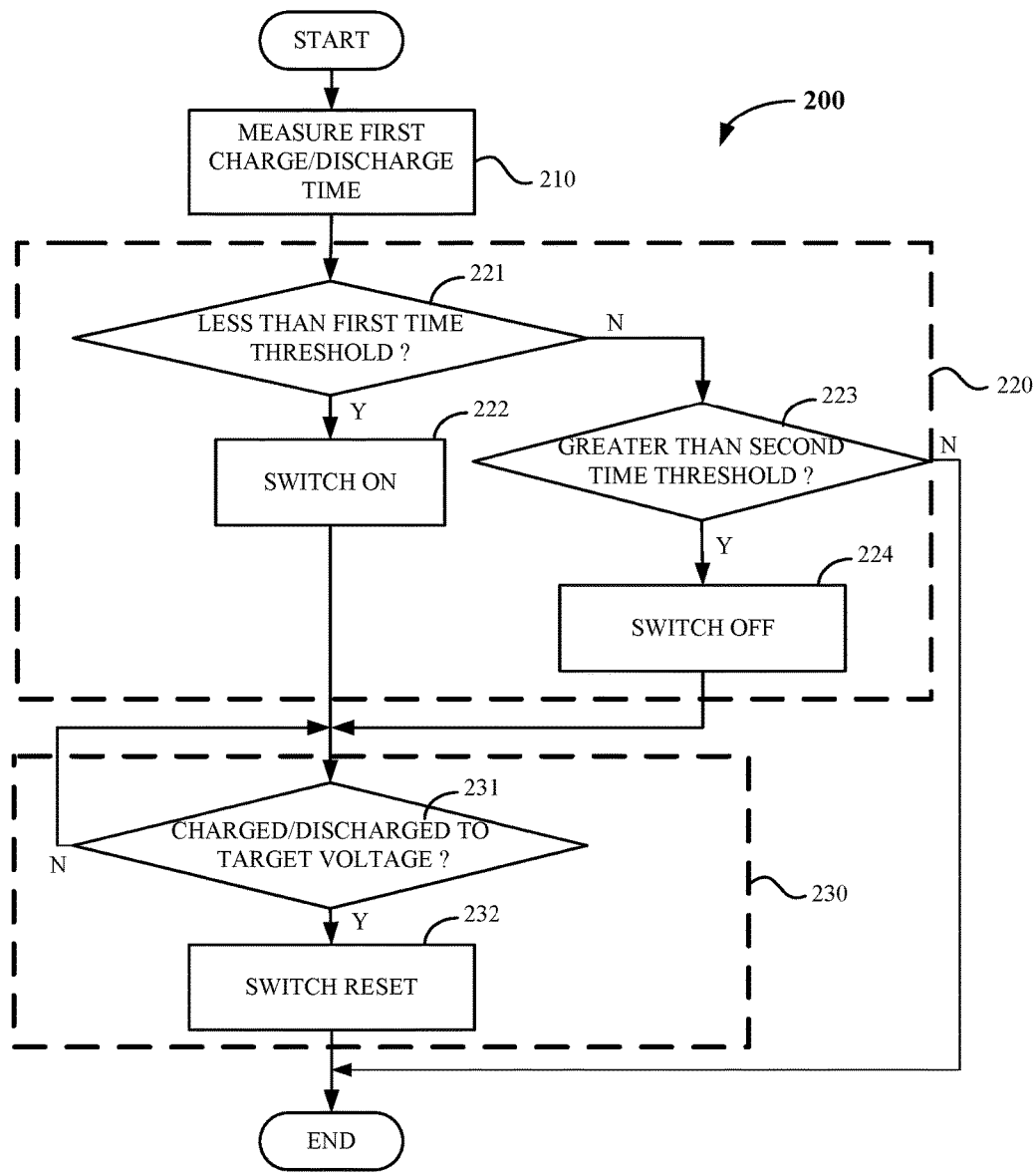
FIG. 2 shows a flow chart of a method for controlling charging/discharging of a capacitor module according to an embodiment of the present disclosure.
Figure 3A:
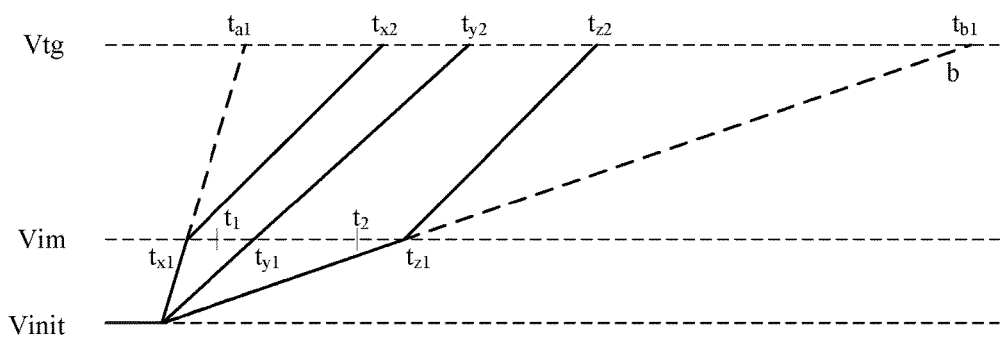
FIG. 3A schematically shows a change in a voltage across the capacitor module during charging.
Figure 3B:
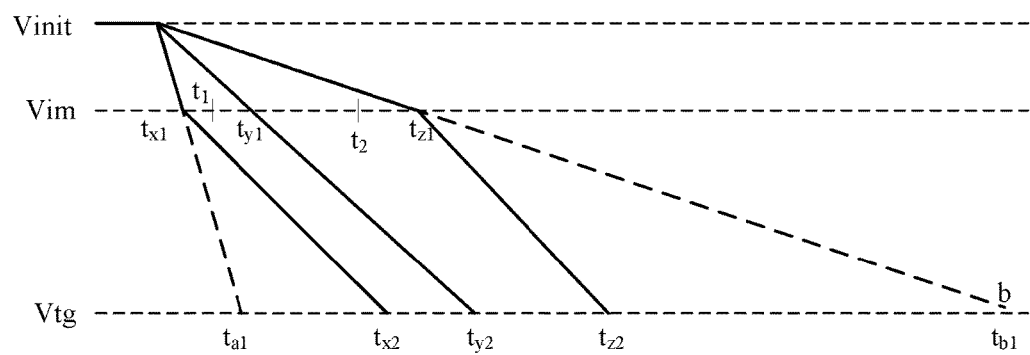
FIG. 3B schematically shows a change in a voltage across the capacitor module during discharging.

FIG. 2 shows a flow chart of a method 200 for controlling charging/discharging of a capacitor module according to an embodiment of the present disclosure, and FIGS. 3A and 3B schematically show changes in the voltage across the capacitor module during charging and discharging, respectively.

At step 210, a first charge/discharge time is measured for the capacitor module 10 being charged/discharged from an initial voltage Vinit to an intermediate voltage Vim.

At step 220, a second charge/discharge time for the capacitor module 10 being further charged/discharged from the intermediate voltage Vim to a target voltage Vtg is adjusted by controlling on/off of at least one of the switches depending on the first charge/discharge time. Specifically, a determination is made at step 221 as to whether the first charge/discharge time is less than a first time threshold. If so, the method 200 proceeds to step 222 where at least one of the switches is controlled to be switched on; if not, the method 200 proceeds to step 223. In the examples of FIGS. 3A and 3B, since the first charge/discharge time tx1 is less than the first time threshold t1, the at least one of the switches is controlled to be switched on to increase the capacitance value of the capacitor module 10. In this way, the second charge/discharge time for the capacitor module 10 being charged/discharged from the intermediate voltage Vim to the target voltage Vtg is prolonged, so that the total charge/discharge time is prolonged from ta1 to tx2. A determination is made at step 223 as to whether the first charge/discharge time is greater than a second time threshold. If so, the method 200 proceeds to step 224 where the at least one of the switches is controlled to switch off. In the examples of FIGS. 3A and 3B, since the first charge/discharge time tz1 is greater than the second time threshold t2, the at least one of the switches is controlled to be switched off, thereby decreasing the capacitance value of the capacitor module 10. In this way, the second charge/discharge time for the capacitor module 10 being charged/discharged from the intermediate voltage Vim to the target voltage Vtg is shortened, so that the total charge/discharge time is shortened from tb1 to tz2. It will be understood that if the first charge/discharge time (e.g., ty1) is between the first time threshold t1 and the second time threshold t2, the capacitance value of the capacitor module 10 may not be adjusted and the method 200 ends. In this case, the total charge/discharge time ty2 is obtained.

The method 200 further includes resetting the at least one of the switches to an initial state in which the at least one of the switches is prior to the beginning of the charging/discharging in response to the capacitor module 10 being charged to the target voltage (step 230). Specifically, it is determined at step 231 whether the capacitor module 10 is charged/discharged to the target voltage, and if so, at least one of the switches is reset to the initial state at step 232. After that, the method 200 ends.

As can be seen from FIGS. 3A and 3B, the fluctuation in the adjusted total charge/discharge time is limited to a smaller range as compared with the case where the capacitance value of the capacitor module 10 is not adjusted. This is good for the operation of the electronic equipment.

Those skilled in the art will realize that the various illustrative circuits and method steps described in connection with the embodiments disclosed herein may be implemented as electronic hardware, computer software, or combinations thereof. Whether such functionality is implemented as hardware or software depends upon the particular application and design constraints imposed on the overall system.

Figure 4:
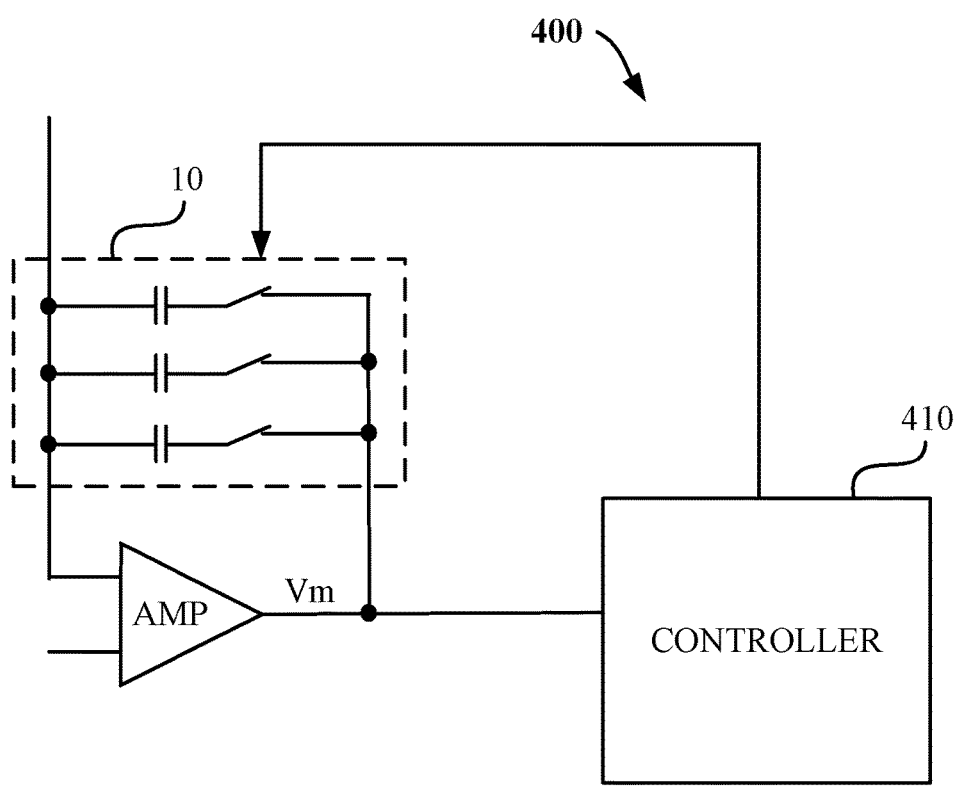
FIG. 4 schematically shows a block diagram of an apparatus for controlling charging/discharging of a capacitor module according to an embodiment of the present disclosure.

FIG. 4 schematically shows a block diagram of an apparatus 400 for controlling charging/discharging of a capacitor module according to an embodiment of the present disclosure. As compared to the embodiment of FIG. 1, the functions of the first comparator CMP1, the adjustment circuit 120 and the reset circuit 130 in the measurement circuit 110 are now implemented with a controller 410.

In examples, the controller 410 may be provided with a built-in or external analog-to-digital converter for acquiring the voltage measurement signal Vm output by the operational amplifier AMP. In some implementations, the operational amplifier AMP may even be omitted, in which case the voltage across the capacitor module 10 may be acquired directly by the analog-to-digital converter. The controller 410 may be programmed to compare the acquired voltage measurements with respective preset values to achieve the functions of the first comparator CMP1 and the second comparator CMP2. The controller 410 may also be provided with a built-in timer/counter for counting the charge/discharge time of the capacitor module 10. The controller 410 may be programmed to implement the function of the adjustment circuit 120. The controller 410 provides respective control signals to the switches in the capacitor module 10 to control the on/off of each switch.

The controller 410 may be implemented in many ways, such as with dedicated hardware, to perform the various functions discussed herein. A "processor" is one example of a controller 410 that employs one or more microprocessors that can be programmed using software (e.g., microcode) to perform the various functions discussed herein. The controller 410 may be implemented with or without a processor, and may also be implemented as a combination of dedicated hardware that performs some functions and a processor that performs other functions (e.g., one or more programmed microprocessors and associated circuits). Examples of controller components that may be employed in various embodiments of the present disclosure include, but are not limited to, conventional microprocessors, application specific integrated circuits (ASICs), and field programmable gate arrays (FPGAs).

The apparatuses 100 and 400 described in the above embodiments may be included in various electronic devices, for example, a display apparatus in order to adjust the charge/discharge time of the capacitors in the display apparatus.

Various modifications and alternations of the foregoing exemplary embodiments of the present disclosure will be readily apparent to those skilled in the relevant arts in view of the foregoing description in conjunction with reading the accompanying drawings. Any and all modifications will still fall within the scope of the non-limiting and exemplary embodiments of this disclosure. Furthermore, other embodiments of the disclosure described herein will come to mind to one skilled in the art to which these embodiments pertain having the benefit of the teachings presented in the foregoing descriptions and the associated drawings.

Therefore, it is to be understood that the embodiments of the disclosure are not to be limited to the specific embodiments disclosed and that modifications and other embodiments are also intended to be encompassed within the scope of the appended claims. Although specific terms are used in this document, they are used in a generic and descriptive sense only and not for purposes of limitation.

What is claimed is:

1. A method for controlling charging/discharging of a capacitor module, the capacitor module comprising a plurality of branches connected in parallel, each of the branches comprising a capacitor and a switch connected in series with the capacitor, the method comprising:
   measuring a first charge/discharge time for the capacitor module being charged/discharged from an initial voltage to an intermediate voltage; and
   adjusting a second charge/discharge time for the capacitor module being further charged/discharged from the intermediate voltage to a target voltage by controlling on/off of at least one of the switches depending on the first charge/discharge time, the intermediate voltage being between the initial voltage and the target voltage.

2. The method of claim 1, wherein the adjusting comprises:
   controlling the at least one of the switches to switch on in response to the first charge/discharge time being less than a first time threshold; and
   controlling the at least one of the switches to switch off in response to the first charge/discharge time being greater than a second time threshold,
   wherein the first time threshold is less than the second time threshold.

3. The method of claim 1, further comprising resetting the at least one of the switches to an initial state in which the at least one of the switches is before initiation of the charging/discharging in response to the capacitor module being charged/discharged to the target voltage.

4. The method of claim 2, further comprising resetting the at least one of the switches to an initial state in which the at least one of the switches is before initiation of the charging/discharging in response to the capacitor module being charged/discharged to the target voltage.

5. An apparatus for controlling charging/discharging of a capacitor module, the capacitor module comprising a plurality of branches connected in parallel, each of the branches comprising a capacitor and a switch connected in series with the capacitor, the apparatus comprising:
   a measurement circuit configured to measure a first charge/discharge time for the capacitor module being charged/discharged from an initial voltage to an intermediate voltage; and
   an adjustment circuit configured to adjust a second voltage for the capacitor module being further charged/discharged from the intermediate voltage to a target voltage by controlling on/off of at least one of the switches depending on the first charge/discharge time, the intermediate voltage being between the initial voltage and the target voltage.

6. The apparatus of claim 5, wherein the adjustment circuit is configured to:
   control the at least one of the switches to switch on in response to the first charge/discharge time being less than a first time threshold; and
   control the at least one of the switches to switch off in response to the first charge/discharge time being greater than a second time threshold,
   wherein the first time threshold is less than the second time threshold.

7. The apparatus of claim 6, wherein the measurement circuit comprises:
   an operational amplifier for connection in parallel with the capacitor module, the operational amplifier having an output operable to output a voltage measurement signal indicative of a voltage across the capacitor module; and
   a first comparator having a first input connected to the output of the operational amplifier, a second input operable to receive a first voltage signal, and an output operable to output a first output signal, wherein the first voltage signal is indicative of the intermediate voltage, and wherein a transition of the first output signal is indicative of the first charge/discharge time.

8. The apparatus of claim 7, wherein the adjustment circuit comprises a first trigger having a first input connected to the output of the first comparator, a second input operable to receive a first timing signal, and an output operable to output a first trigger signal, wherein the first trigger is configured to output the first trigger signal in response to the transition of the first output signal being earlier than a transition of the first timing signal, wherein the transition of the first timing signal is indicative of the first time threshold, and wherein the first trigger signal is for controlling the at least one of the switches to switch on.

9. The apparatus of claim 8, wherein the adjustment circuit further comprises a second trigger having a first input connected to the output of the first comparator, a second input operable to receive a second timing signal, and an output operable to output a second trigger signal, wherein the second trigger is configured to output the second trigger signal in response to the transition of the first output signal being later than a transition of the second timing signal, wherein the transition of the second timing signal is indicative of the second time threshold, and wherein the second trigger signal is for controlling the at least one of the switches to switch off.

10. The apparatus of claim 8, further comprising a reset circuit configured to reset the at least one of the switches to an initial state in which the at least one of the switches is before initiation of the charging/discharging in response to the capacitor module being charged/discharged to the target voltage.

11. The apparatus of claim 9, further comprising a reset circuit configured to reset the at least one of the switches to an initial state in which the at least one of the switches is before initiation of the charging/discharging in response to the capacitor module being charged/discharged to the target voltage.

12. The apparatus of claim 7, further comprising a reset circuit configured to reset the at least one of the switches to an initial state in which the at least one of the switches is before initiation of the charging/discharging in response to the capacitor module being charged/discharged to the target voltage.

13. The apparatus of claim 12, wherein the reset circuit comprises a second comparator having a first input connected to the output of the operational amplifier, a second input operable to receive a second voltage signal, and an output operable to output a second output signal, wherein the second voltage signal is indicative of the target voltage, and wherein the second output signal is for controlling the at least one of the switches to reset.

14. An apparatus for controlling charging/discharging of a capacitor module, the capacitor module comprising a plurality of branches connected in parallel, each of the branches comprising a switch and a capacitor connected in series with the switch, the apparatus comprising:
a measurement means for measuring a first charge/discharge time for the capacitor module being charged/discharged from an initial voltage to an intermediate voltage; and
an adjustment means for adjusting a second charge for the capacitor module being further charged/discharged from the intermediate voltage to a target voltage by controlling on/off of at least one of the switches depending on the first charge/discharge time, the intermediate voltage being between the initial voltage and the target voltage.

15. The apparatus of claim 14, wherein the adjustment means is for:
controlling the at least one of the switches to switch on in response to the first charge/discharge time being less than a first time threshold; and
controlling the at least one of the switches to switch off in response to the first charge/discharge time being greater than a second time threshold,
wherein the first time threshold is less than the second time threshold.

16. The apparatus of claim 15, further comprising:
a reset means for resetting the at least one of the switches to an initial state in which the at least one of the switches is before initiation of the charging/discharging in response to the capacitor module being charged/discharged to the target voltage.

17. The apparatus of claim 14, further comprising:
a reset means for resetting the at least one of the switches to an initial state in which the at least one of the switches is before initiation of the charging/discharging in response to the capacitor module being charged/discharged to the target voltage.

18. A display apparatus comprising the apparatus of claim 5.

19. A display apparatus comprising the apparatus of claim 14.

* * * * *